US011292253B2

(12) United States Patent
Xie et al.

(10) Patent No.: US 11,292,253 B2
(45) Date of Patent: Apr. 5, 2022

(54) PIEZOELECTRIC PRINTING DEVICE WITH INNER SURFACE ELECTRODE LAYER

(71) Applicant: Suzhou New RealFast Technology CO., LTD, Suzhou (CN)

(72) Inventors: Yonglin Xie, Suzhou (CN); Xiaofei Zhang, Suzhou (CN); Huiqiang Lv, Suzhou (CN); Jianbin Lu, Suzhou (CN); Xuan Du, Suzhou (CN)

(73) Assignee: SUZHOU RUIFA PRINTING TECHNOLOGY CO, LTD., Suzhou (CN)

( * ) Notice: Subject to any disclaimer, the term of this patent is extended or adjusted under 35 U.S.C. 154(b) by 60 days.

(21) Appl. No.: 16/912,783

(22) Filed: Jun. 26, 2020

(65) Prior Publication Data
US 2021/0354465 A1    Nov. 18, 2021

(30) Foreign Application Priority Data
May 13, 2020    (CN) .......................... 202010386134.7

(51) Int. Cl.
*B41J 2/14* (2006.01)
*H01L 41/047* (2006.01)
(52) U.S. Cl.
CPC ...... *B41J 2/14201* (2013.01); *H01L 41/0475* (2013.01)
(58) Field of Classification Search
None
See application file for complete search history.

(56) References Cited

U.S. PATENT DOCUMENTS

| 5,255,016 | A | 10/1993 | Usui et al. |
| 5,640,184 | A | 6/1997 | Moynihan et al. |
| 6,243,114 | B1 | 6/2001 | Yano et al. |
| 2003/0098632 | A1* | 5/2003 | Takeuchi ........... G02B 6/12004 |
| | | | 310/328 |
| 2015/0367644 | A1* | 12/2015 | Naganuma ............... B41J 2/161 |
| | | | 347/71 |
| 2017/0056995 | A1* | 3/2017 | Collins ................ B23K 1/0016 |

FOREIGN PATENT DOCUMENTS

| CN | 107344453 A | 11/2017 | |
| WO | WO-2013085543 A1 * | 6/2013 | .......... B41J 2/04581 |

* cited by examiner

*Primary Examiner* — Erica S Lin
(74) *Attorney, Agent, or Firm* — Gary A. Kneezel

(57) ABSTRACT

A piezoelectric printing device includes a piezoelectric plate and a substrate with at least one row of drop ejectors. Each drop ejector includes a pressure chamber on a first side of the substrate and a nozzle on a second side of the substrate. The piezoelectric plate is attached to the substrate by a bonding layer. A first electrode layer is disposed on a first surface of the piezoelectric plate that is proximate to the first side of the substrate. The first electrode layer includes signal lines and ground traces corresponding to each pressure chamber. A second electrode layer including signal input pads and ground return pads is disposed on the first side of the substrate. Signal lines and ground traces in the first electrode layer are electrically connected to signal input pads and ground return pad(s) respectively on the second electrode layer through solder joints.

28 Claims, 11 Drawing Sheets

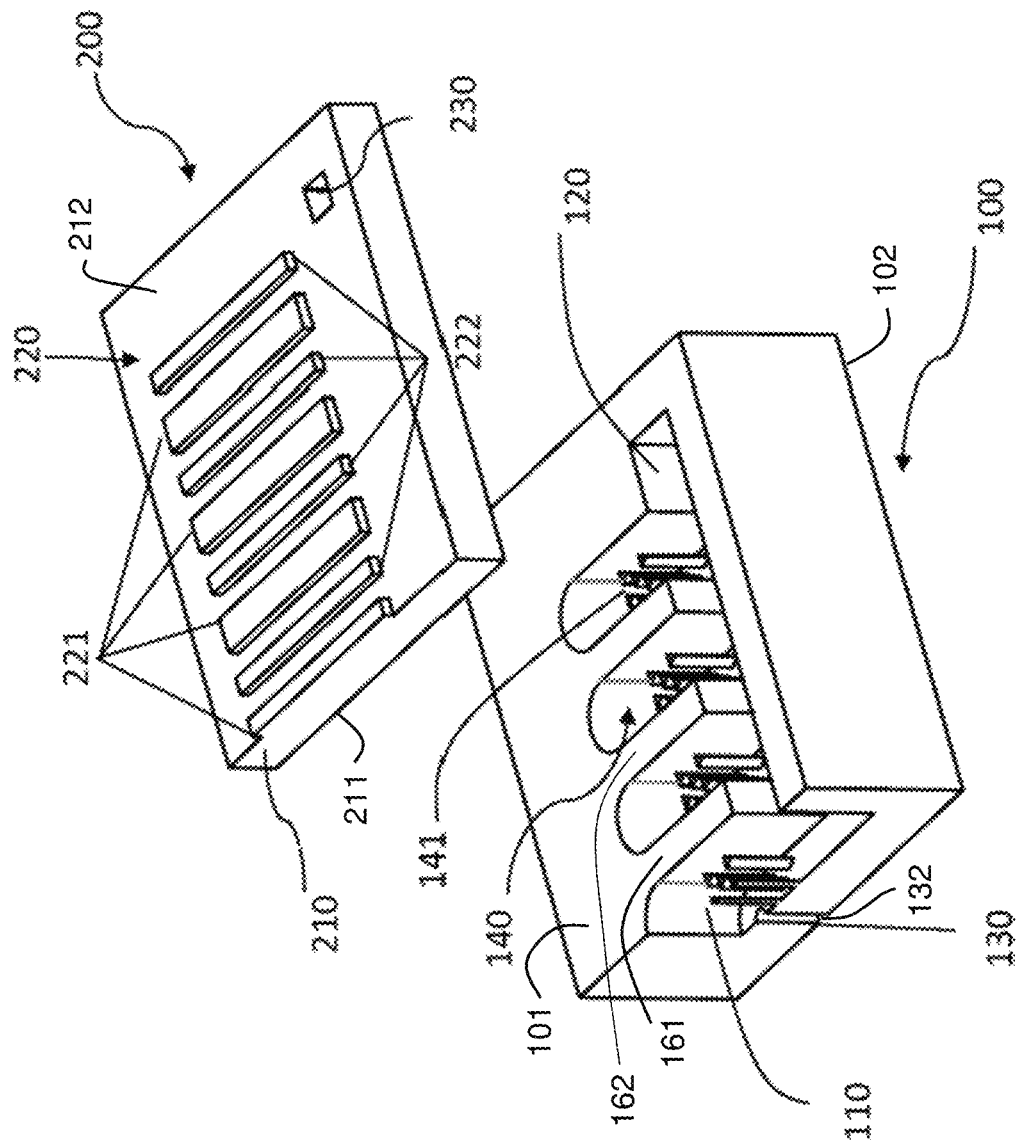
FIG. 1 – PRIOR ART

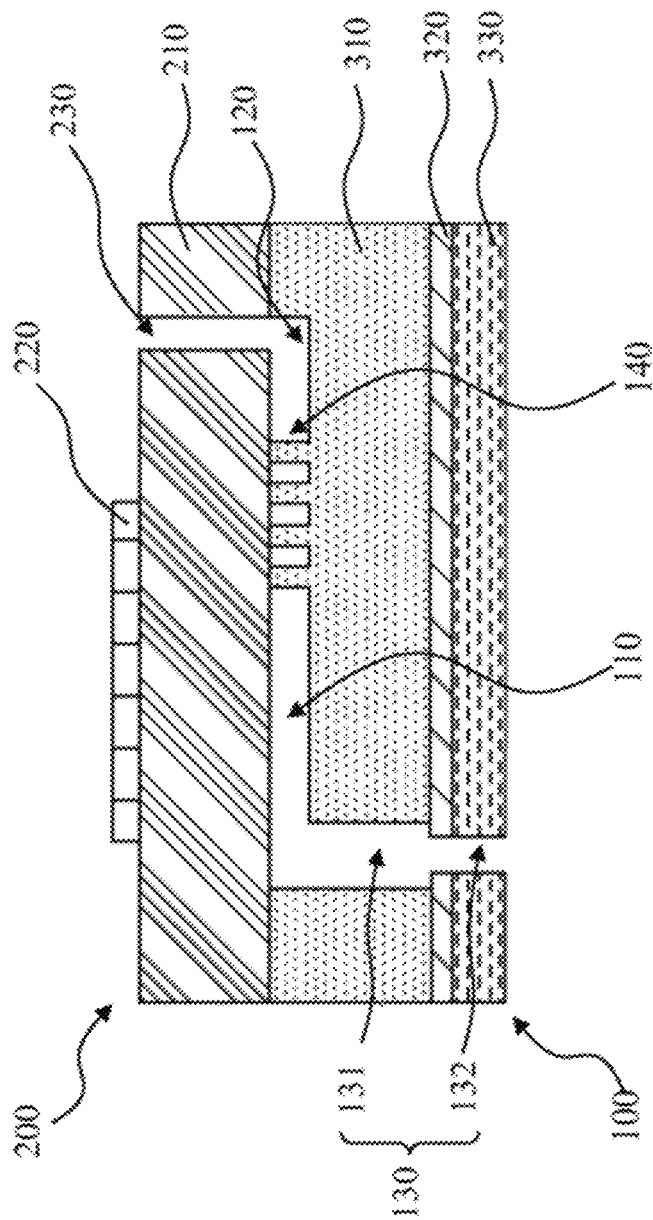
FIG. 2 – PRIOR ART

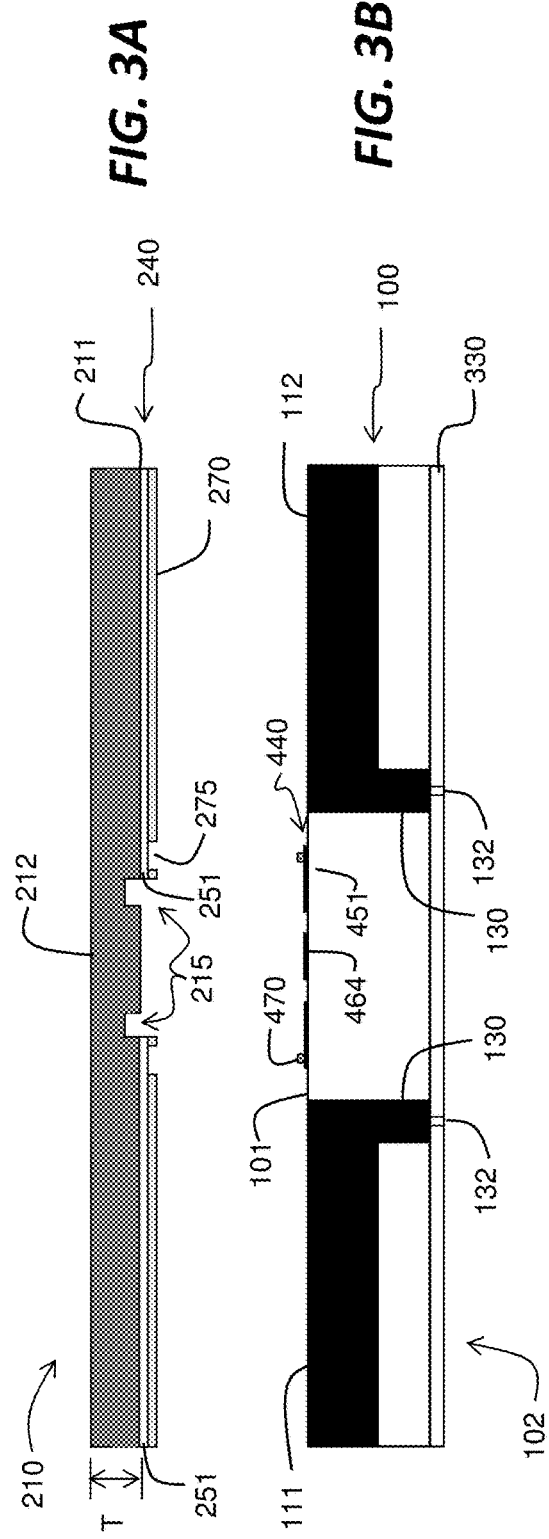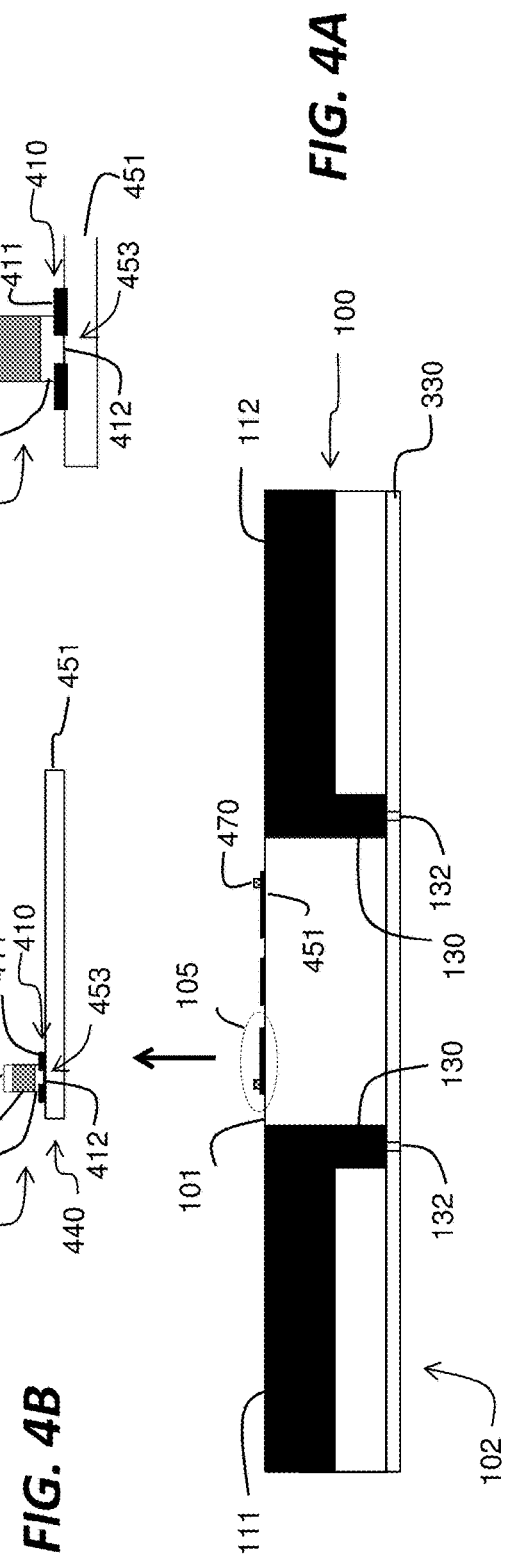

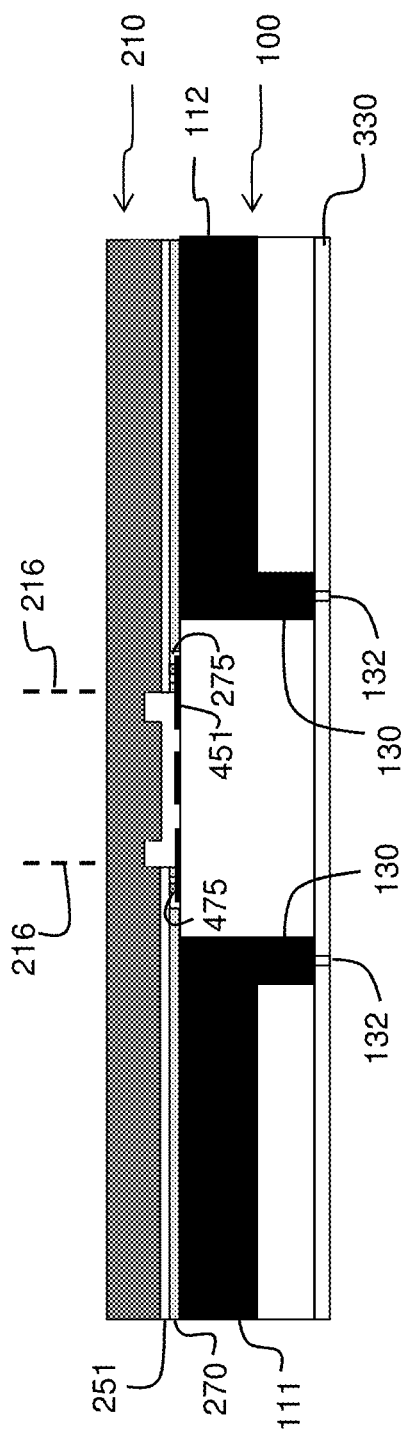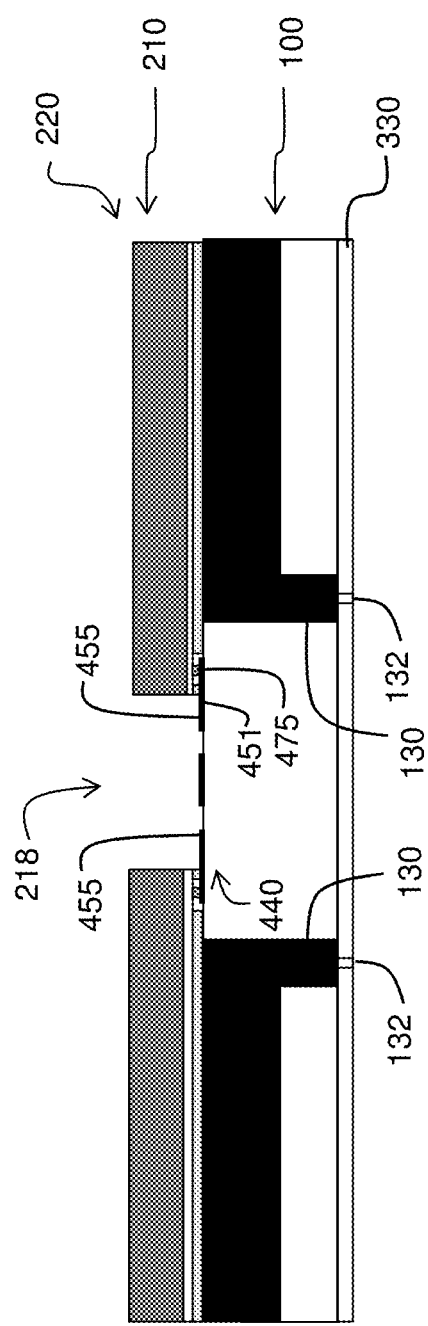

PIEZOELECTRIC PRINTING DEVICE WITH INNER SURFACE ELECTRODE LAYER

CROSS REFERENCE TO RELATED APPLICATIONS

Reference is made to commonly assigned, patent application Ser. No. 16/912,769, entitled: "Piezoelectric printing device with outer layer surface electrode"; patent application Ser. No. 16/912,816, entitled: "Piezoelectric printing device with vias through piezoelectric plate"; patent application Ser. No. 16/912,791, entitled: "Piezoelectric printhead and printing system"; patent application Ser. No. 16/912,833, entitled: "Piezoelectric printhead for multiple inks and printing system"; and patent application Ser. No. 16/912,844, entitled: "Piezoelectric printing device with single layer inner electrode"; filed concurrently herewith, and incorporated herein by reference.

FIELD OF THE INVENTION

This invention pertains to the field of piezoelectric inkjet printing and more particularly to configurations of a piezoelectric printing device.

BACKGROUND OF THE INVENTION

Inkjet printing is typically done by either drop-on-demand or continuous inkjet printing. In drop-on-demand inkjet printing ink drops are ejected onto a recording medium using a drop ejector including a pressurization actuator (thermal or piezoelectric, for example). Selective activation of the actuator causes the formation and ejection of a flying ink drop that crosses the space between the printhead and the recording medium and strikes the recording medium. The formation of printed images is achieved by controlling the individual formation of ink drops, as is required to create the desired image. The desired image can include any pattern of dots directed by image data. It can include graphic or text images. It can also include patterns of dots for printing functional devices or three dimensional structures if appropriate inks are used. Ink can include colored ink such as cyan, magenta, yellow or black. Alternatively ink can include conductive material, dielectric material, magnetic material, or semiconductor material for functional printing. Ink can include biological, chemical or medical materials.

Motion of the recording medium relative to the printhead during drop ejection can consist of keeping the printhead stationary and advancing the recording medium past the printhead while the drops are ejected, or alternatively keeping the recording medium stationary and moving the printhead. The former architecture is appropriate if the drop ejector array on the printhead can address the entire region of interest across the width of the recording medium. Such printheads are sometimes called pagewidth printheads. A second type of printer architecture is the carriage printer, where the printhead drop ejector array is somewhat smaller than the extent of the region of interest for printing on the recording medium and the printhead is mounted on a carriage. In a carriage printer, the recording medium is advanced a given distance along a medium advance direction and then stopped. While the recording medium is stopped, the printhead carriage is moved in a carriage scan direction that is substantially perpendicular to the medium advance direction as the drops are ejected from the nozzles. After the carriage-mounted printhead has printed a swath of the image while traversing the print medium, the recording medium is advanced; the carriage direction of motion is reversed; and the image is formed swath by swath.

A drop ejector in a drop-on-demand inkjet printhead includes a pressure chamber having an ink inlet for providing ink to the pressure chamber, and a nozzle for jetting drops out of the chamber. In a piezoelectric inkjet printing device, a wall of the pressure chamber includes a piezoelectric element that causes the wall to deflect into the ink-filled pressure chamber when a voltage pulse is applied, so that ink is forced through the nozzle. Piezoelectric inkjet has significant advantages in terms of chemical compatibility and ejection latitude with a wide range of inks (including aqueous-based inks, solvent-based inks, and ultraviolet-curing inks), as well as the ability to eject different sized drops by modifying the electrical pulse.

Piezoelectric printing devices also have technical challenges that need to be addressed. Because the amount of piezoelectric displacement per volt is small, the piezoelectric chamber wall area must be much larger than the nozzle area in order to eject useful drop volumes, so that each drop ejector is relatively large. The width of each drop ejector in a row of drop ejectors is limited by the nozzle spacing in that row. As a result, the pressure chambers typically have a length dimension that is much greater than the width dimension. Printing applications that require printing at high resolution and high throughput require large arrays of drop ejectors with nozzles that are closely spaced. Staggered rows of nozzles can provide dots at close spacing on the recording medium through appropriate timing of firing of each row of drop ejectors. However, with many staggered rows, the size of the piezoelectric printing device becomes large.

A further challenge is that, unlike thermal inkjet printing devices that typically include integrated logic and driving electronics so that the number of leads to the device is reduced, a piezoelectric printing device typically has individual electrical leads for each drop ejector that need to be connected to the driving electronics. In order to apply a voltage across the piezoelectric element independently for each drop ejector in order to eject drops when needed, each drop ejector needs to be associated with two electrodes. The two types of electrodes are sometimes called positive and negative electrodes, or individual and common electrodes for example.

Some types of piezoelectric printing devices are configured such that the two types of electrodes are on opposite surfaces of the piezoelectric element. For making electrical interconnection between the piezoelectric printing device and the driving electronics it can be advantageous to have the two types of electrodes on a same surface of the piezoelectric printing device.

U.S. Pat. No. 5,255,016 discloses a piezoelectric inkjet printing device in which positive and negative comb-shaped electrodes are formed on an outer surface of a piezoelectric plate. The teeth of the comb, at least in some regions, extend across the width of the drop ejector. A portion of the positive electrode extends along one side edge of the piezoelectric plate, and a portion of the negative electrode extends along an opposite side edge of the piezoelectric plate. Individual piezoelectric plates are provided for each drop ejector, resulting in a structure that would be unwieldy to manufacture with large arrays of drop ejectors at tight spacing.

U.S. Pat. No. 6,243,114 discloses a piezoelectric inkjet printing device in which the common electrode on an outer surface of the piezoelectric plate is comb-shaped with one electrode tooth extending along each side wall of the pressure chamber and a central common electrode tooth extending along the length of the pressure chamber. Two individual electrodes extend along the length of the pressure chamber on opposite sides of the central common electrode tooth.

U.S. Pat. No. 5,640,184 discloses a piezoelectric inkjet printing device in which pressure chambers for a row of nozzles extend alternately in opposite directions from the row of nozzles. A common electrode on a surface of the piezoelectric plate extends along the row of nozzles and has electrode teeth that extend alternately in opposite directions over the side walls of the pressure chambers. Interlaced between the electrode teeth of the common electrode is a spaced array of individual electrodes that are positioned directly over the pressure chambers. When a voltage is applied to an individual electrode, the piezoelectric plate is mechanically distorted in a shear mode toward the corresponding pressure chamber to cause ejection of an ink drop.

Chinese Patent Application Publication No. 107344453A discloses a piezoelectric inkjet printing device shown in FIGS. 1 and 2, which are taken from '453 with some additional labeling added to FIG. 1 for clarification. A substrate 100 includes a first side 101 in which a row of pressure chambers 110 is arranged. Each pressure chamber 110 is bounded by side walls 161 and 162. A channel 130 leads from pressure chamber 110 to a nozzle 132 that is disposed on a second side 102 of the substrate 100. The width of the pressure chamber 110 between side walls 161 and 162 is W. An ink groove 120 is fluidically connected to an end of each of the pressure chambers 110 in order to provide ink to them. A damping structure 140 including a plurality of pillars 141 is provided in each pressure chamber 110 between the ink groove 120 and the channel 130. A driving cover plate 200 includes a piezoelectric plate 210, made of lead zirconate titinate (PZT) for example. A first surface 211 of the piezoelectric plate 210 is bonded to the first side 101 of the substrate 100. An electrode layer 220 is disposed on an outer second surface 212 of the piezoelectric plate 210. The electrode layer 220 includes positive electrodes 221 that are each disposed over the length of the pressure chambers 110, as well as negative electrodes 222 that are disposed over the length of the side walls 161 and 162 between pressure chambers 110. An ink inlet port 230 is provided through the piezoelectric plate 210 to bring ink from an external ink supply to the ink groove 120 in the substrate 100. Nozzle 132 extends from a flow path 131 in silicon 310 through an oxide layer 320 and a nozzle layer 330 (FIG. 2).

It has been found that piezoelectric printing devices having both types of electrodes on an outer surface of a piezoelectric plate away from the pressure chamber have pressure chamber wall displacements that are highly dependent upon the thickness of the piezoelectric plate. For example, the integrated displacement of the plate wall can be a factor of ten higher for a plate thickness of 40 microns than for a plate thickness of 100 microns. By comparison, for piezoelectric printing devices having both types of electrodes on an inner surface of the piezoelectric plate proximate to the pressure chamber have an integrated displacement of the plate wall that is only 4% higher for a plate thickness of 40 microns than for a plate thickness of 100 microns. Moreover, the displacement for a plate thickness of 40 microns is more than twice as large if the electrodes are on the inner surface of the piezoelectric plate than if they are on the outer surface of the piezoelectric plate. As a result, drop ejector configurations having the electrodes on the inner surface of the piezoelectric plate can be operated at greater efficiency with lower voltage or smaller chamber dimensions. In addition the velocities and volumes of ejected drops are less sensitive to manufacturing variability in piezoelectric plate thickness, resulting in improved print quality. What is needed is a configuration of electrodes and electrical lines to facilitate electrical interconnection to the electrodes disposed on the inner surface of the piezoelectric printing device. Furthermore, what is needed is a configuration of rows of drop ejectors on the piezoelectric printing device in a space-efficient manner that can provide ejection of drops for high printing resolution and fast printing throughput.

SUMMARY OF THE INVENTION

According to an aspect of the present invention, a piezoelectric printing device includes a piezoelectric plate and a substrate with an array of at least one row of drop ejectors, such that each row is aligned along a row direction. Each drop ejector includes a pressure chamber disposed on a first side of the substrate, the pressure chamber being bounded by a first side wall and a second side wall. Each drop ejector also includes a nozzle disposed in a nozzle layer that is formed on a second side of the substrate opposite to the first side. The piezoelectric plate has a first surface that is disposed proximate to the first side of the substrate. A bonding layer is disposed between the piezoelectric plate and the substrate, the bonding layer having at least one bonding layer window. A first electrode layer is disposed on the first surface of the piezoelectric plate. The first electrode layer includes a first signal line corresponding to each pressure chamber, each first signal line leading to a corresponding first signal interconnect pad. The first electrode layer also includes ground traces disposed on both sides of each pressure chamber, the ground traces being electrically connected to at least one first ground interconnect pad. A second electrode layer is disposed on the first side of the substrate. The second electrode layer includes a second signal line corresponding to each first signal line. Each second signal line leads to a corresponding second signal interconnect pad and a signal input pad, such that the first signal interconnect pad is electrically connected to the second signal interconnect pad through a signal solder joint. The second electrode layer also includes a second ground interconnect pad corresponding to each first ground interconnect pad. Each first ground interconnect pad is electrically connected to the corresponding second ground interconnect pad through a ground solder joint. The second electrode layer further includes at least one ground return pad that is electrically connected to a plurality of second ground interconnect pads. At least one common ground bus is electrically connected to the at least one ground return pad.

This invention has the advantage that the electrodes are configured to enable high efficiency of drop ejection with reduced variability of drop volume and drop velocity. In addition, the electrical lines of the piezoelectric printing device and their corresponding connection pads are configured for compact and reliable electrical interconnection to a printhead package. A further advantage is that the piezoelectric drop ejectors are configured in a space efficient manner and are capable of high printing resolution and fast printing throughput.

BRIEF DESCRIPTION OF THE DRAWINGS

FIG. 1 shows an exploded perspective view of a prior art piezoelectric drop ejector array configuration;

FIG. 2 shows a cross-section of a single drop ejector of the type shown in FIG. 1;

FIG. 3A shows a cross-section of a portion of a piezoelectric plate;

FIG. 3B shows a cross-section of portion of a substrate corresponding to the portion of the piezoelectric plate shown in FIG. 3A;

FIG. 4A is similar to FIG. 3B and indicates an electrode layer on the substrate with an associated solder bump;

FIGS. 4B and 4C shows magnified views of the electrode layer with the associated solder bump shown in FIG. 4A;

FIG. 5 shows the portion of the piezoelectric plate of FIG. 3A mechanically and electrically bonded to the portion of the substrate shown in FIG. 3B;

FIG. 6 shows the bonded device of FIG. 5 after removing a portion of the piezoelectric plate in order to expose an interconnect pad region of the electrode layer on the substrate;

It is to be understood that the attached drawings are for purposes of illustrating the concepts of the invention and may not be to scale. Identical reference numerals have been used, where possible, to designate identical features that are common to the figures.

DETAILED DESCRIPTION OF THE INVENTION

The invention is inclusive of combinations of the embodiments described herein. References to "a particular embodiment" and the like refer to features that are present in at least one embodiment of the invention. Separate references to "an embodiment" or "particular embodiments" or the like do not necessarily refer to the same embodiment or embodiments; however, such embodiments are not mutually exclusive, unless so indicated or as are readily apparent to one of skill in the art. The use of singular or plural in referring to the "method" or "methods" and the like is not limiting. It should be noted that, unless otherwise explicitly noted or required by context, the word "or" is used in this disclosure in a non-exclusive sense. Words such as "over", "under", "above" or "below" are intended to describe positional relationships of features that are in different planes, but it is understood that a feature of a device that is "above" another feature of the device in one orientation would be "below" that feature if the device is turned upside down.

Piezoelectric printing devices according to embodiments of the invention have signal lines and ground traces disposed in a first electrode layer on an inner surface of the piezoelectric plate proximate to the pressure chamber. In order to facilitate electrical interconnection of the piezoelectric printing device, a second electrode layer is disposed on an adjacent surface of the substrate to which the piezoelectric plate is bonded. The signal lines and ground traces in the first electrode layer are connected to signal input pads and at least one ground return pad in the second electrode layer through solder joints. The signal input pads and the at least one ground return pad are exposed for connecting the assembled piezoelectric printing device.

Figure 10:
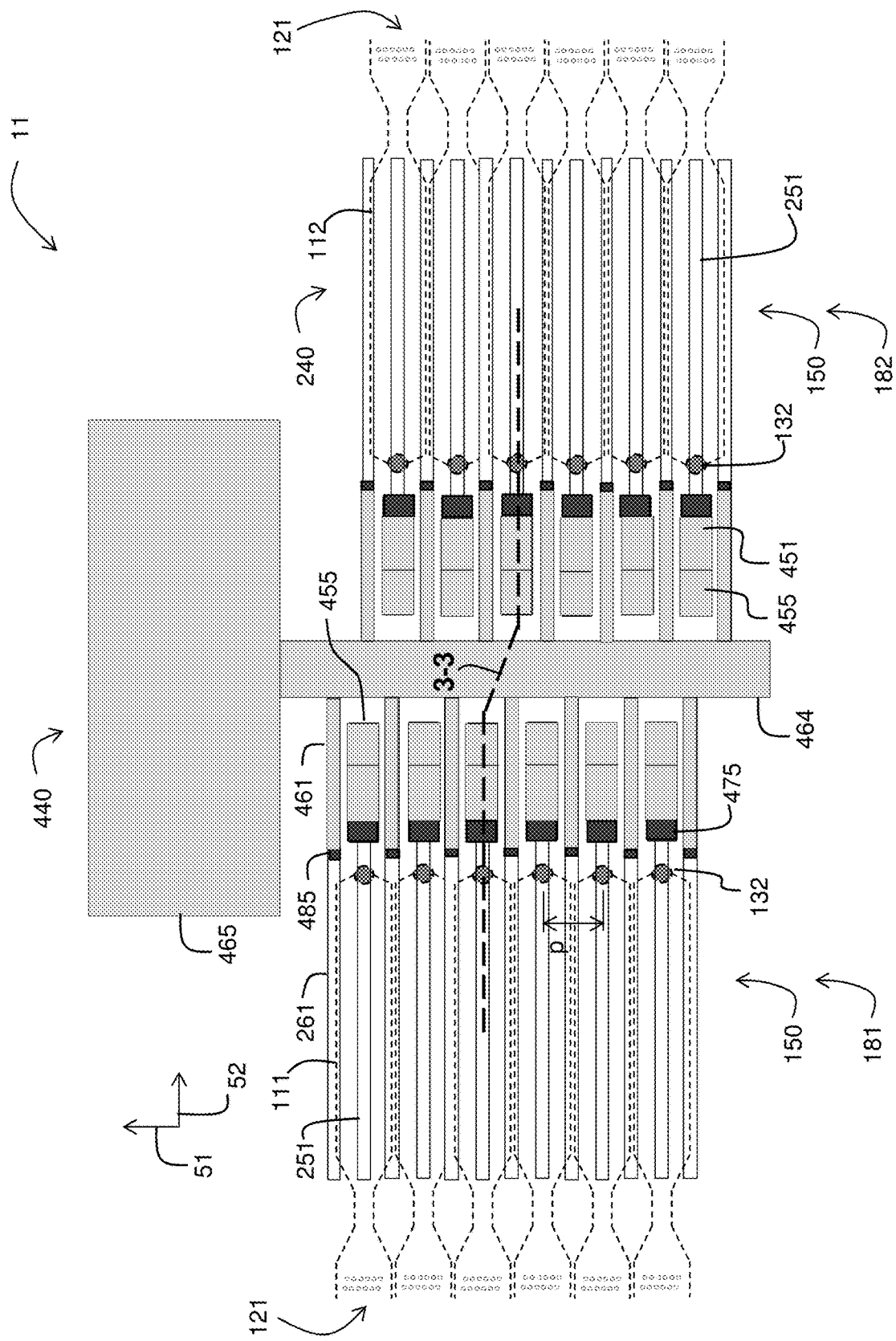
FIG. 10 shows a portion of a piezoelectric printing device according to an embodiment.

FIG. 3A shows a cross-section of a piezoelectric plate 210 through dashed line 3-3 (FIG. 10). FIG. 3B shows a cross-section of a corresponding portion of a substrate 100. Piezoelectric plate 210 has a thickness T. Substrate 100 includes a pair of pressure chambers 111 and 112, which extend outwardly from a central region. Each pressure chamber 111 and 112 includes a channel 130 that leads to a nozzle 132 disposed in a nozzle layer 330. Inner first surface 211 of the piezoelectric plate 210 includes grooves 215 to facilitate subsequent removal of a portion of the piezoelectric plate 210, as described below with reference to FIG. 6, to expose pads for electrically connecting the assembled piezoelectric printing device. First signal lines 251 (part of a first electrode layer 240) on inner first surface 211 of the piezoelectric plate 210 extend over pressure chambers 111 and 112 in the assembled device. A patterned bonding layer 270 is disposed over the first signal lines 251 and other portions of first surface 211 of the piezoelectric plate 210. Bonding layer 270 includes bonding layer windows 275. The bonding layer 270 can be a polymer adhesive, for example. Bonding layer 270 is disposed between the piezoelectric plate 210 and the substrate 100 and joins piezoelectric plate 210 to the first side 101 of substrate 100 as shown in FIG. 5. In addition, bonding layer 270 isolates the ink in pressure chambers 111 and 112 from the electrical lines and the piezoelectric plate 210. In some embodiments an additional insulating layer (not shown) can be added between the bonding layer 270 and the piezoelectric plate 210, or between the bonding layer 270 and the first side 101 of the substrate 100 for improved reliability. The additional insulation layer can be silicon oxide or silicon nitride, for example.

As shown in FIG. 3B, a second electrode layer 440 is disposed on first surface 101 of the substrate 100. Second electrode layer 440 includes a plurality of second signal lines 451 as well as a common ground bus 464. First electrode layer 240 and second electrode layer 440 can each include a copper layer and can each include at least one chrome layer. In the FIG. 3B example, solder bumps 470 are disposed on the second signal lines 451 in the second electrode layer 440 for connection to the first signal lines 251 in the first electrode layer 240 on the first surface 211 of the piezoelectric plate 210 (FIG. 3A).

FIG. 4A is similar to FIG. 3B and includes a dashed ellipse 105 to indicate a region that is shown at higher magnification in FIG. 4B and at still higher magnification in FIG. 4C. An insulating layer 410, such as SiO2 is formed and patterned on second signal line 451 to include an insulator window 412. Insulating layer 410 includes an outer surface 411 that is not in contact with second signal line 451. A second signal interconnect pad 453 corresponds to a portion of second signal line 451 that is exposed within insulator window 412. A A solder bump 470, which includes indium tin alloy solder 471 for example, connects to second signal interconnect pad 453. A base 473 of solder bump 470 is disposed over the insulating layer window 410 and makes contact with second signal interconnect pad 453 through insulator window 412. Although the solder portion 471 of solder bump 470 subsequently flows during the bonding of piezoelectric plate 210 to substrate 100, base 473 can be made of a material, such as copper or copper and chrome, which does not change shape during the bonding process. In the example shown in FIG. 4B, a cap 472, such as a layer of gold, is disposed over the solder 471. In the FIG. 4B example the insulating layer 410 is disposed over the second electrode layer 440 on the first side 101 of the substrate 100. Insulating layer 410 has an insulating window 412 corresponding to each second signal interconnect pad 453 and also an insulating window 412 corresponding to each second ground interconnect pad 463 (FIG. 8B). As described below with reference to FIGS. 5, 8A, 8B and 13A-C, signal solder joints 475 are formed over the insulator windows 412 between second signal lines 451 (at second signal interconnect pads 453) in the second electrode layer 440 and first signal lines 251 (at first signal interconnect pads 253) in the first electrode layer 240. Similarly, ground solder joints 485 (FIG. 7B) are formed over the insulator windows 412 between ground leads 461 (at second ground interconnect pads 463) in the second electrode layer and ground traces 261 (at first ground interconnect pads 263) in the first electrode layer 240.

Figure 8A:
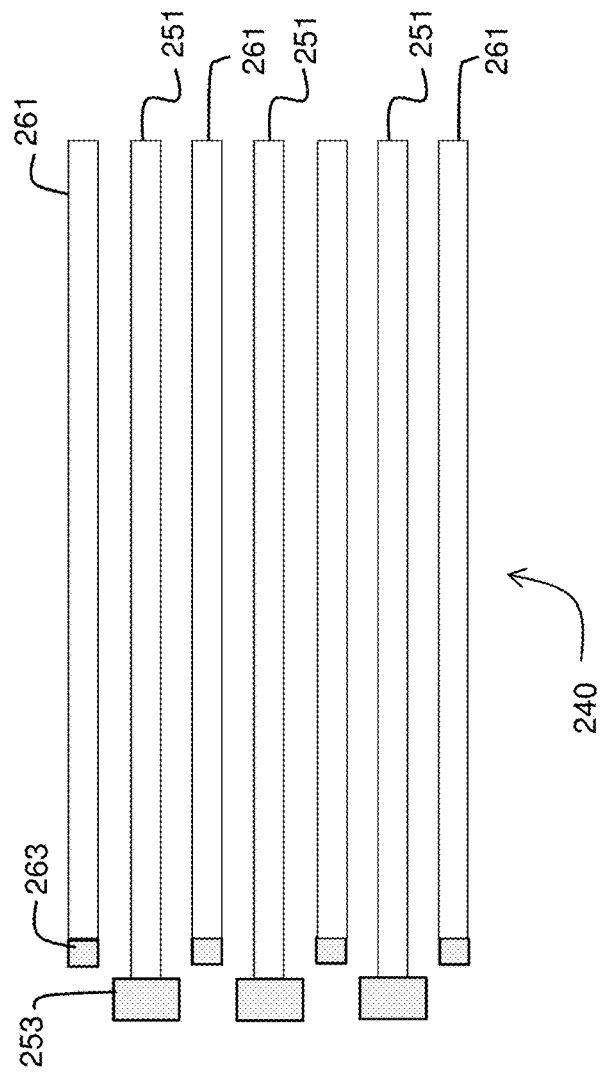
FIG. 8A shows a top view of electrical lines from FIG. 7B on the inner surface of the piezoelectric plate.

Alternatively and in similar fashion, solder bumps 470 can be formed on the first electrode layer 240 on the first surface 211 of the piezoelectric plate 210. In such cases, insulating layer 410 is disposed over the first electrode layer 240 with insulator windows 412 corresponding to each first signal interconnect pad 253 and each first ground interconnect pad 263 (FIG. 8A). The solder bumps 470 for signal solder joints 475 and the ground solder joints 485 are disposed over the insulator windows 412 in the insulating layer 410.

FIG. 5 shows the piezoelectric plate 210 of FIG. 3A bonded to the substrate 100 of FIG. 3B. During the heat curing of bonding layer 270, the solder 471 in solder bumps 470 (FIG. 4B) flows to form signal solder joints 475 between second signal lines 451 (at second signal interconnect pads 453) and first signal lines 251 (at first signal interconnect pads 253). Bonding layer 270, which can include materials such as polyimide, SU-8 epoxy and benzocyclobutene-based polymer, provides a structural joint between piezoelectric plate 210 and substrate 100. Solder joints 475 are isolated within bonding layer windows 275 in bonding layer 270 so that they are not exposed to the ink in pressure chambers 111 and 112. After the piezoelectric plate 210 is bonded to the substrate 100, it is diced or etched along cut lines 216 to intersect with grooves 215 (FIG. 5) so that a portion of piezoelectric plate 210 is removed, thereby forming an opening 218 which provides access to portions of second electrode layer 440, including second signal lines 451 and signal input pads 455 as shown in FIG. 6.

Figure 7A:
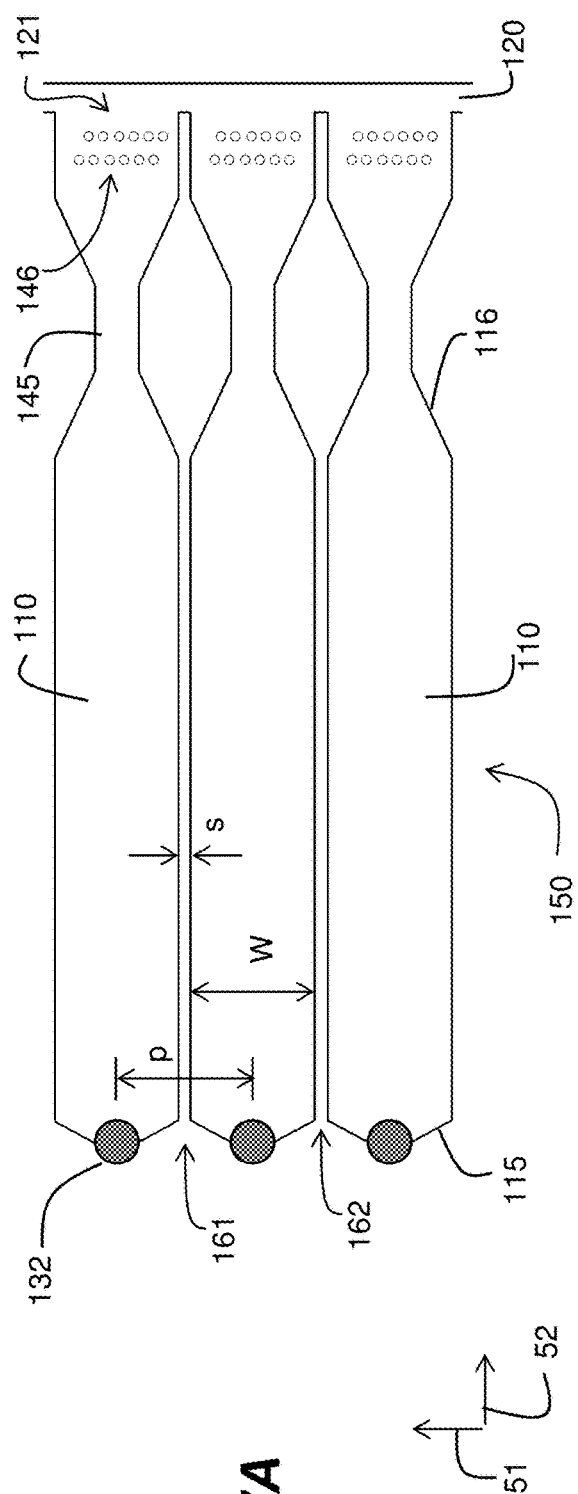
FIG. 7A shows a top view of three drop ejectors in a substrate.

FIG. 7A shows a top view of a row of three drop ejectors 150 formed on a substrate 100 (FIG. 3B) each drop ejector 150 including a pressure chamber 110 and a nozzle 132. Nozzles 132 (as well as drop ejectors 150) are aligned along a row direction 51 and the centers of adjacent nozzles are spaced at a pitch p. Pressure chambers 110 have a width W along the row direction 51 and are bounded by side walls 161 and 162, each having a wall width s, such that W+s=p. In order to provide sufficiently large area of the pressure chamber 110, it is advantageous to have W greater than 0.8p in many embodiments. In other words, typically s is less than 0.2p. The nozzle 132 is disposed near a first end 115 of the pressure chamber 110. In the example shown in FIG. 7A, ink enters the pressure chamber 110 from ink groove 120 (connected to an ink inlet port 230 as in FIGS. 1 and 2), through ink inlet 121, through filter 146 and through restrictor 145 near second end 116 of pressure chamber 110 opposite the first end 115. Ink groove 120 provides ink to a plurality of pressure chambers 110. In other examples described below, ink enters ink inlets 121 directly from an edge of the substrate 100. Filter 146 can include pillars similar to the pillars 141 shown in prior art FIG. 1. Restrictor 145 provides flow impedance (as does filter 146) to help limit the flow of ink toward inlet 121 when a drop of ink is being ejected from pressure chamber 110, thereby directing more of the pressure of the deflecting piezoelectric plate to propelling the drop of ink.

Figure 7B:
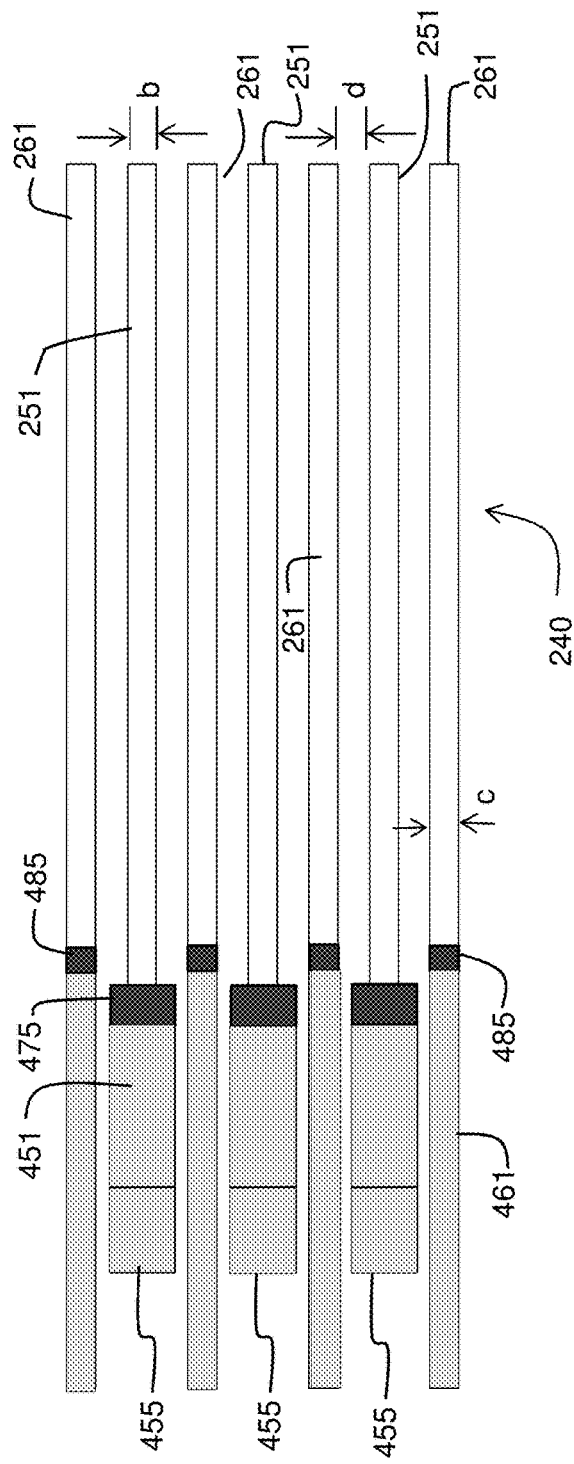
FIG. 7B shows a view of electrical lines on an inner surface of the piezoelectric plate and on the surface of the substrate corresponding to the drop ejectors shown in FIG. 4A.
Figure 8B:
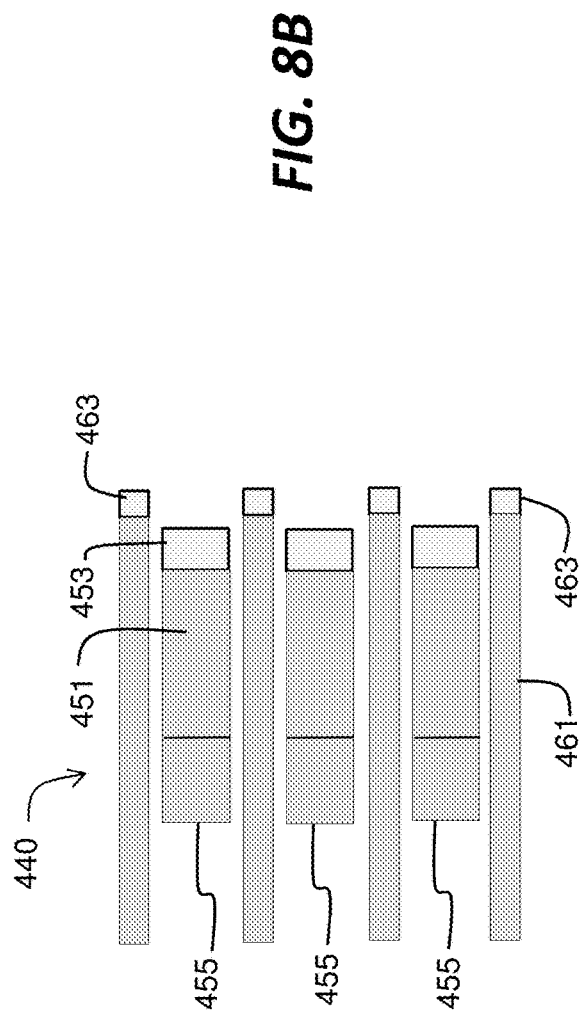
FIG. 8B shows a top view of electrical lines from FIG. 7B on the surface of the substrate.

FIG. 7B shows a top view of electrical lines corresponding to the drop ejectors 150 shown in FIG. 7A. First signal lines 251 and ground traces 261 are provided as part of first electrode layer 240 disposed on inner first surface 211 piezoelectric plate 210 (FIG. 3A). Widths and spacings of first signal lines 251 and ground traces 261 are configured for efficient driving of the piezoelectric plate 210. First signal lines 251 are electrically connected to second signal lines 451 in second electrode layer 440 on first side 101 of substrate 100 (FIG. 3B) by signal solder joints 475 (FIGS. 5 and 6). Signal input pads 455 are disposed on second signal lines 451. Ground traces 261 are electrically connected to ground leads 461 in second electrode layer 440 on first side 101 of substrate 100 (FIG. 3B) by ground solder joints 485, which are similar to the signal solder joints 475 described above, although they can have different cross-sectional areas and shapes.

FIG. 8A shows the portions of first electrode layer 240 on inner first surface 211 of piezoelectric plate 210 (FIG. 3A) corresponding to FIG. 7B. FIG. 8B shows the portions of second electrode layer 440 on first side 101 of substrate 100 (FIG. 3B) corresponding to FIG. 7B. First signal interconnect pads 253 (FIG. 8A) are electrically connected to second signal interconnect pads 453 (FIG. 8B) through signal solder joints 475 (FIG. 7B). Second signal interconnect pads 453 are connected to corresponding second signal lines 451 and signal input pads 455. First ground interconnect pads 263 (FIG. 8A) are electrically connected to second ground interconnect pads 463 (FIG. 8B) through ground solder joints 485 (FIG. 7B).

Figure 9:
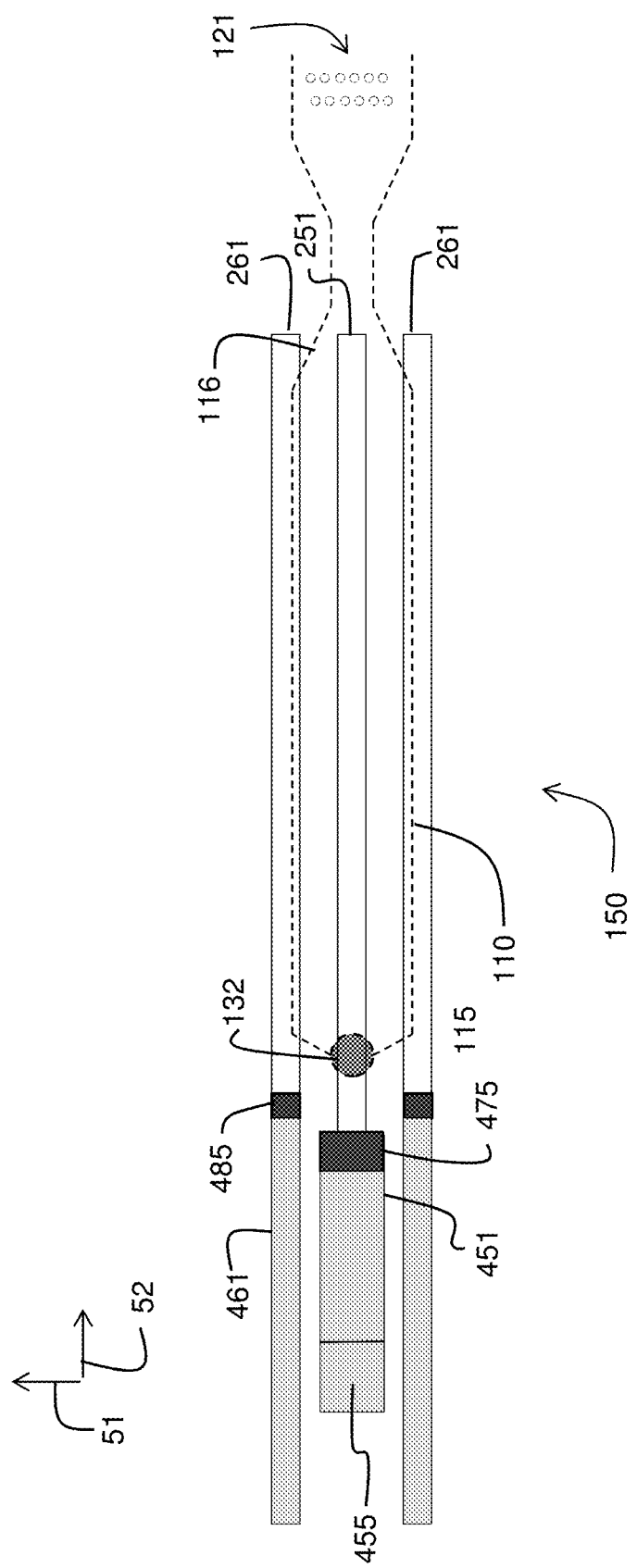
FIG. 9 shows a top view of a single drop ejector and some of its corresponding electrical lines.

FIG. 9 shows a top view of a single drop ejector 150 (dashed lines) that is disposed in a substrate 100 below the corresponding first signal lines 251 and ground traces 261 disposed on the piezoelectric plate 210. A first signal line 251 is disposed over each corresponding pressure chamber 110 and extends in a direction 52 that is perpendicular to the row direction 51. In the example shown in FIG. 9, first signal line 251 is disposed over a center of the corresponding pressure chamber 110. Each first signal line 251 is electrically connected to a corresponding second signal input line 451 and signal input pad 455 on substrate 100 (FIG. 6) through signal solder joint 475. Nozzle 132 is disposed near a first end 115 of the pressure chamber 110 proximate to the signal solder joint 475. First signal line 251 has a width b (FIG. 7B) that is greater than 0.1 times the width W (FIG. 7A) of the pressure chamber 110. First signal line width b is also greater than 0.2 times the thickness T of the piezoelectric plate 210 (FIG. 3A). Ground traces 261 are aligned over the first side wall 161 and the second side wall 162. Ground traces 261 are typically disposed midway between corresponding pressure chambers 110 and extend in a direction 52 that is perpendicular to row direction 51. Ground trace 261 has a width c (FIG. 7B) that is greater than the width s (FIG. 7A) of side walls 161 and 162 in many embodiments. A distance d (FIG. 7B) between a first signal line 251 and an adjacent ground trace 261 is typically greater than 0.1 W (FIG. 7A). A distance d between a first signal line 251 and an adjacent ground trace 261 is typically greater than 0.5 T and less than 2 T (FIG. 3A).

FIG. 10 shows a top view of a portion of a piezoelectric printing device 11 according to an embodiment of the invention. A pair of staggered rows 181 and 182 of drop ejectors 150 (similar to those described above with reference to FIGS. 3A through 9) is disposed on the substrate 100. Each row is aligned along row direction 51. First row 181 and second row 182 are spaced apart from each other along a first direction 52 that is perpendicular to row direction 51. Each drop ejector 150 in first row 181 includes a pressure chamber 111 and each drop ejector 150 in second row 182 includes a pressure chamber 112. The pressure chambers 111 and 112 are disposed on a first side 101 of the substrate 100. In the example shown in FIG. 10, ink is fed into the ink inlets 121 of each drop ejector 150 directly from the edges of substrate 100 that extend along row direction 51. The pressure chambers 111 and 112 are each bounded by a first side wall 161 and a second side wall 162. Each drop ejector also includes a nozzle 132 that is in fluidic communication with the corresponding pressure chamber 111 or 112. The nozzles 132 are disposed in a nozzle layer 330 on a second side 102 of the substrate 100. A first electrode layer 240 disposed on an inner first surface 211 of a piezoelectric plate 210 includes a first signal line 251 corresponding to each drop ejector 150 in each of the staggered rows 181 and 182 of drop ejectors 150. Each first signal line 251 leads to a corresponding signal input pad 455 that is disposed in second electrode layer 440 on substrate 100 through a signal solder joint 475 and a second signal line 451. The second electrode layer 440 also includes at least one common ground bus 464 that is connected to ground traces 261 in first electrode layer 240 through ground leads 461 on second electrode layer 440 and ground solder joints 485. Ground traces 261 are aligned over the first and second side walls 161 and 162 of each pressure chamber. The common ground bus 464 extends along the row direction 51 and leads to a ground return pad 465. In the example shown in FIG. 10, the common ground bus 464 is disposed between the signal input pads 455 of the first staggered row 181 of drop ejectors 150 and the signal input pads 455 of the second staggered row 182 of drop ejectors 150. In addition, the signal input pads 455 of the first staggered row 181 of drop ejectors and the signal input pads 455 of the second staggered row 182 of drop ejectors are disposed between the nozzles 132 of the first staggered row 181 of drop ejectors and the nozzles 132 of the second staggered row 182 of drop ejectors. All signal input pads 455 and ground return pad(s) 465 are exposed through opening 218 (FIG. 6) in piezoelectric plate 210. Such a configuration of signal input pads 455 and ground return pad(s) 465 is advantageous for providing electrical interconnection from piezoelectric printing device 11 in a compact region to a printhead package (not shown).

The nozzles 132 in row 181 are spaced at pitch p, and the nozzles 132 in row 182 are also spaced at pitch p. The two rows are offset by a distance p/2 along the row direction 51. As a result, if a recording medium (not shown) is moved relative to piezoelectric printing device 11 along first direction 52, ejecting ink drops by the drop ejectors in row 181 at a suitable timing relative to ejecting ink drops by the drop ejectors in row 182 can print a composite row of dots on the recording medium with a dot spacing of p/2. It is preferable to have a small printing region on the piezoelectric printing device 11, i.e. a relatively short distance between the nozzles 132 in row 181 and the nozzles 132 in row 182 along first direction 52. In order to accomplish this, the drop ejectors 150 in rows 182 are oppositely oriented, such that the nozzles 132 of the first staggered row 181 are proximate to the nozzles 132 of the second row, and such that the pressure chambers 111 of the first row 181 and the pressure chambers 112 of the second row 182 extend in opposite directions along first direction 52 from their respective nozzles 132. The printing region can be further reduced on the piezoelectric printing device 11 in the embodiment shown below in FIG. 12.

Figure 11:
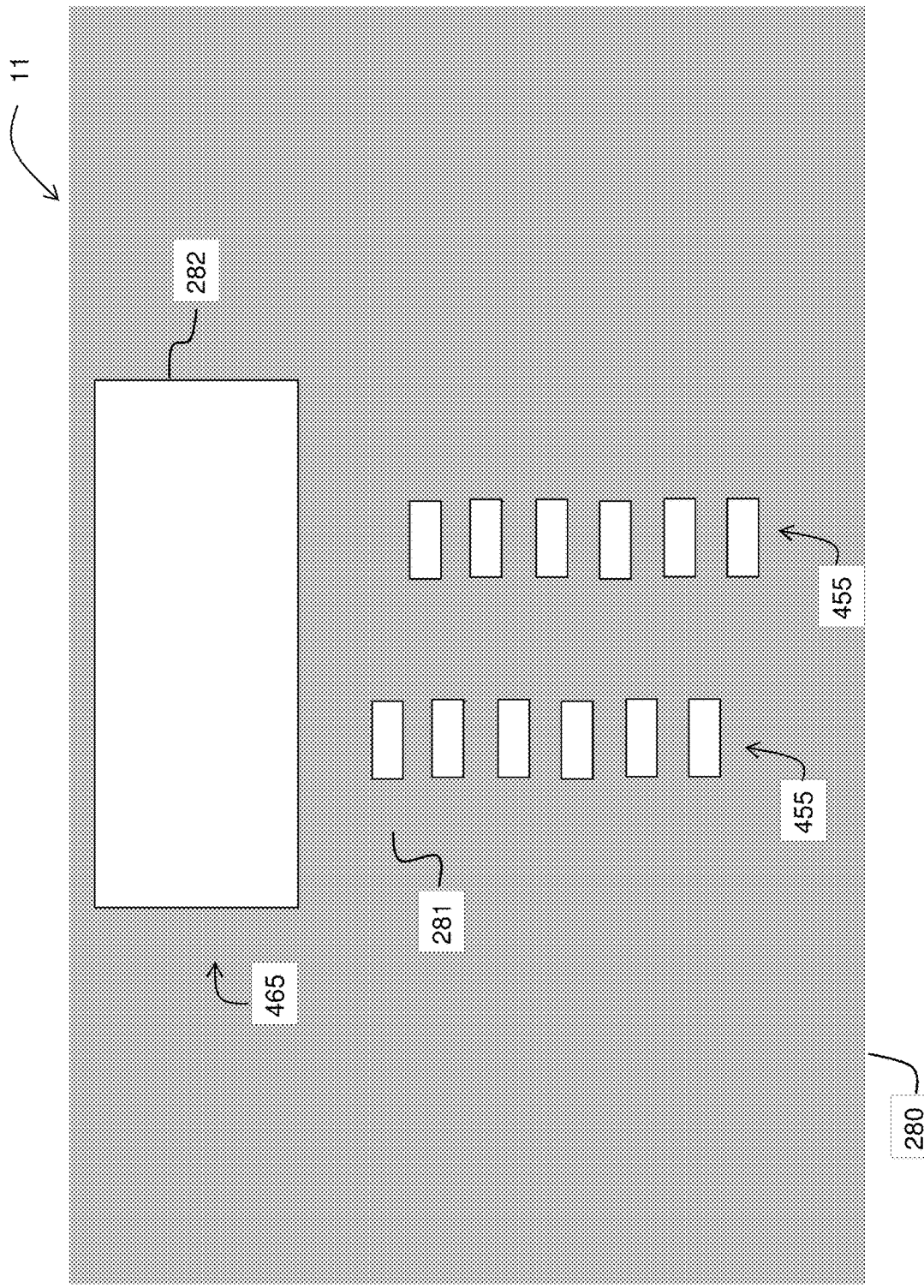
FIG. 11 shows a masking layer with windows.

As shown in the top view of FIG. 11, in order to provide more reliable electrical interconnection without shorts, an electrically insulating masking layer 280 can be disposed over the second electrode layer 440, such that the masking layer 280 includes windows 281 over the signal input pads 455 and a window 282 over the ground return pad 465 in order to expose the pads for electrical interconnection.

As described above with reference to FIGS. 3A through 11, piezoelectric printing device 11 includes a substrate 100, an array of at least one row 181 of drop ejectors 150, a piezoelectric plate 210, a bonding layer 270, a first electrode layer 240, a second electrode layer 440, and at least one common ground bus 464. Each row 181 and 182 of drop ejectors 150 is aligned along a row direction 51. Each drop ejector 150 includes a pressure chamber 110/111/112 disposed on a first side 101 of the substrate 100. The pressure chamber is bounded by a first side wall 161 and a second side wall 162. Each drop ejector 150 also includes a nozzle 132 disposed in a nozzle layer 330 that is disposed on a second side 102 of the substrate 100 opposite to the first side 101. The piezoelectric plate 210 has a first surface 211 that is proximate to the first side 101 of the substrate 100. Bonding layer 270 is disposed between the piezoelectric plate 210 and the substrate 100 and has bonding layer windows 275. First electrode layer 240 is disposed on the first surface 211 of the piezoelectric plate. First electrode layer 240 includes a first signal line 251 corresponding to each pressure chamber 110/111/112. Each first signal line 251 leads to a corresponding first signal interconnect pad 253. First electrode layer 240 also includes ground traces 261 that are disposed on both sides of each pressure chamber 110/111/112. Ground traces 261 are electrically connected to at least one first ground interconnect pad 263. Second electrode layer 440 is disposed on the first side 101 of the substrate 100. Second electrode layer 440 includes a second signal line 451 corresponding to each first signal line 251. Each second signal line 451 leads to a corresponding second signal interconnect pad 453 and a signal input pad 455. The first signal interconnect pad 253 is electrically connected to the second signal interconnect pad 453 through a signal solder joint 475. Second electrode layer 440 also includes a second ground interconnect pad 463. Each first ground interconnect pad 263 is electrically connected to the corresponding second ground interconnect pad 463 through a ground solder joint 485. Second electrode layer 440 further includes at least one ground return pad 465 that is electrically connected to a plurality of second ground interconnect pads 463. The at least one ground return pad 465 is electrically connected to the at least one common ground bus 464.

In the example shown in FIG. 10, the at least one common ground bus 464 is disposed in the second electrode layer 440 on the first side 101 of the substrate 100. Also in the FIG. 10 example, the array of drop ejectors 150 includes at least two staggered rows 181 and 182 of drop ejectors 150 that are disposed on a common substrate 100, such that each row 181 and 182 is aligned along the row direction 51 and spaced apart from other rows 181 and 182 along a direction 52 that is perpendicular to the row direction 51. Additionally, in the FIG. 10 example, the array includes at least one pair of staggered rows 181 and 182 of drop ejectors 150, where at least one ground bus 464 is disposed between the pair of staggered rows 181 and 182. Further, in the FIG. 10 example, the nozzles 132 of a first staggered row 181 are proximate to the nozzles 132 of a second staggered row 182, while the pressure chambers 111 of the first staggered row 181 and the pressure chambers 112 of the second staggered row 182 extend in opposite directions from the respective nozzles 132.

Figure 12:
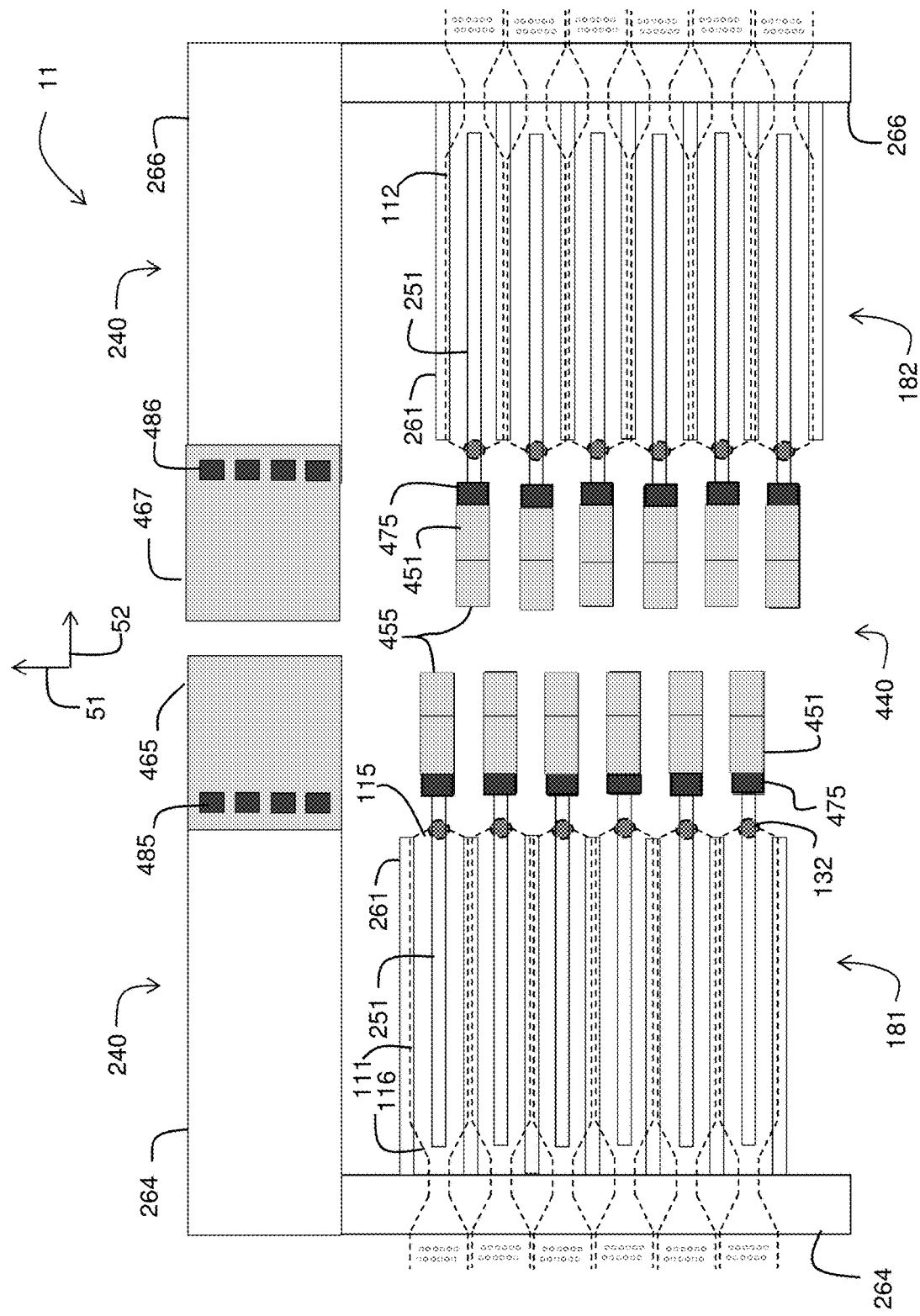
FIG. 12 shows a portion of a piezoelectric printing device according to another embodiment.

FIG. 12 shows a top view of a portion of a piezoelectric printing device 11 according to another embodiment of the invention. The configuration shown in FIG. 12 is similar to that shown in FIG. 10, except the common ground bus 264 is disposed on the first electrode layer 240 and is configured differently. In the embodiment shown in FIG. 12, a first common ground bus 264 is disposed proximate to the second end 116 of the corresponding pressure chambers 111 in first row 181, and a second common ground bus 266 is disposed proximate to the second end 116 of the corresponding pressure chambers 112 in second row 182. Signal solder joints 475 connect first signal lines 251 with second signal lines 451 and signal input pads 455 and are disposed proximate to the first ends 115 of the pressure chambers 111 and 112 in both rows 181 and 182, as they were in the FIG. 10 embodiment. First common ground bus 264 in first electrode layer 240 is connected to a ground return pad 465 in second electrode layer 440 by ground solder joints 485. Second common ground bus 266 in first electrode layer 240 is connected to a ground return pad 467 in second electrode layer 440 by ground solder joints 486. In the example shown in FIG. 12, a similar masking pattern 280 shown in FIG. 11 can be used for exposing the signal input pads and ground return pads for electrical interconnection.

The drop ejectors 150 and electrical lines described above with reference to FIGS. 3-10 and 12 are well suited for a piezoelectric plate 210 that is configured to cause local deflection of the piezoelectric plate 210 into one or more pressure chambers 110/111/112 when a voltage pulse is applied to the electrodes corresponding to those pressure chambers 110/111/112 in order to eject a drop of ink. For such applications, the piezoelectric plate 210 is poled along a direction that is normal to first surface 211. For efficient deflection of the piezoelectric plate of thickness T into a pressure chamber 110/111/112 having a width W, it is advantageous for T to be less than 0.5 W, and in some embodiments for T to be less than 0.3 W.

In an exemplary embodiment, the pitch p in each row is 0.01 inch, so that the nozzles 132 in each row are disposed at 100 nozzles per inch and a composite row of dots can be printed at 200 dots per inch by the pair of rows. For a pitch p=0.01 inch=254 microns a chamber width W can be 224 microns and a side wall width s can be 30 microns, so that s is less than 0.2p as described above with reference to FIG. 7A. It is advantageous for a discrete piezoelectric plate 210 to have a thickness of around 50 microns, so that it is not too fragile. In such an example, T~0.22 W. It can be seen from FIGS. 7A and 7B that nozzle pitch p is equal to the width b of signal line 251 plus the width c of ground trace 261 plus twice the distance d between signal line 251 and ground trace 261, i.e. p=b+c+2d. In an example, width b of first signal line 251 is 90 microns, width c of ground trace 261 is 90 microns and distance d is 37 microns. For the example where W=224 microns and d=37 microns, the distance d between a first signal line 251 and an adjacent ground trace 261 is greater than 0.1 W. In addition in this example, the width b of first signal line 251 is greater than 0.1 W. Further, for a thickness T of the piezoelectric plate 210 of 50 microns, the distance d=37 microns between a first signal line 251 and an adjacent ground trace 261 is greater than 0.5 T and less than 2 T, and the width b of a first signal line 251 is greater than 0.2 T.

In the embodiments described above with reference to FIGS. 10 and 12 there has been a single pair of staggered rows 181 and 182 of drop ejectors 150. In other embodiments (not shown) there can be additional pairs of staggered rows of drop ejectors that can be used to provide higher printing resolution or increased ink coverage, or can eject different types of ink (such as different colors of ink) for each pair of staggered rows, or can eject different ranges of drop sizes for each pair of staggered rows.

Figure 13A:
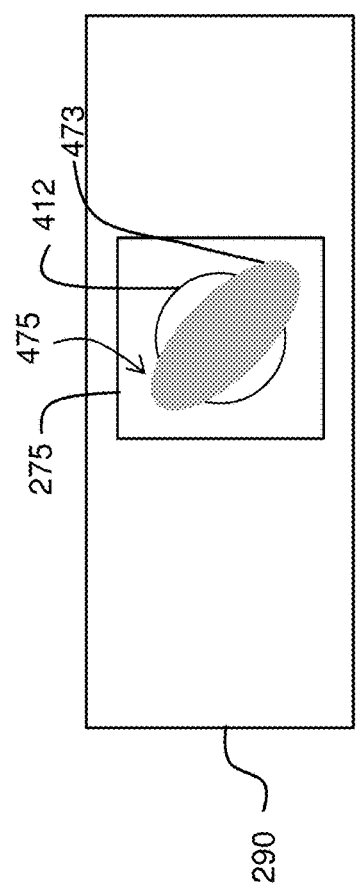
FIGS. 13A through 13C show various configurations of the bonding layer window, the insulator window and the solder joint cross-section.
Figure 13B:
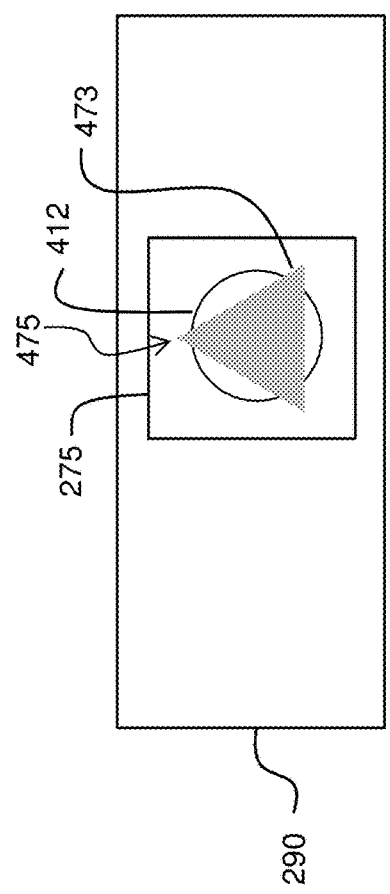
Figure 13C:
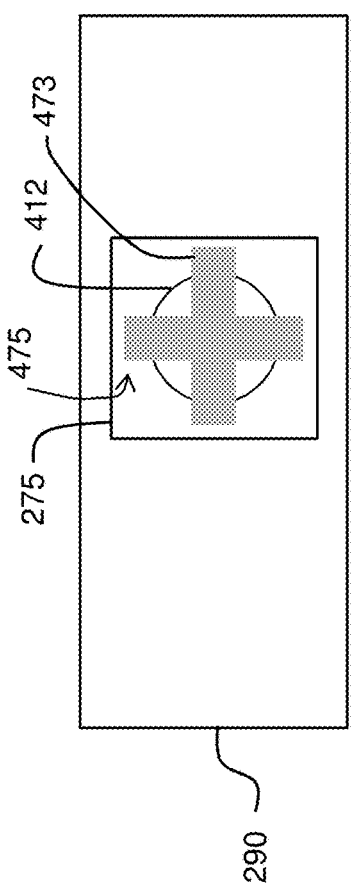

As described above with reference to FIG. 4B, solder bumps 470 and the resulting solder joints 475 and 485 can be formed over insulator windows 412 in the insulating layer 410 on the first electrode layer 240 or the second electrode layer 440. In either case it has been found that relative sizes of the solder joints and the corresponding insulator windows and bonding layer windows, as well as the cross-sectional shape of the solder joints can facilitate successful electrical connection between lines in the first electrode layer 240 and the second electrical layer 440, mechanical bonding between the piezoelectric plate 210 and the substrate 100, and fluidic isolation of the solder joints from ink in the pressure chambers. FIGS. 13A, 13B and 13C show top views of different examples. In each case, pad 290 can be a first signal interconnect pad 253, a second signal interconnect pad 453, a first ground interconnect pad 263 or a second ground interconnect pad 463 for example. In each case, bonding layer window 275 is shown as a square opening and insulator window 412 is shown as a circular opening, but other shapes are possible. In each case, the cross-section of the solder joint 475 is noncircular. In the example shown in FIG. 13A, the cross-section of solder joint 475 is elliptical. In the example shown in FIG. 13B, the cross-section of solder joint 475 is triangular. In the example shown in FIG. 13C, the cross-section of solder joint 475 is shaped like a cross. For both the FIG. 13B example and the FIG. 13C example the solder joint 475 cross-section is shown as being polygonal. Actually, even if the solder portion 471 of solder bump 470 (FIG. 4C) is polygonal, the solder joint 475 will include rounded corners due to flow of the solder 471. For embodiments where the base 473 is made of a material such as copper or copper and chrome, the base 473 of solder joint 475 will retain its original shape after bonding. Herein a cross-section of a solder joint is understood to include the cross-section of the base 473. Herein the term "substantially polygonal" means that the shape is recognizably similar to a polygon but with rounded inside or outside corners. FIG. 13C shows an example of a solder joint cross-section having a concave portion. In other words, a portion of the perimeter of the solder joint cross-section extends inward toward the center. Non-circular shapes, polygonal shapes and concave shapes of the solder joint 475 facilitate the simultaneous mechanical bonding of the bonding layer 270 and the formation of the solder joint 475 due to surface tension forces in the flowing solder 471.

In addition, as shown in the examples of FIGS. 13A through 13C, for each solder joint 475 the area of the corresponding insulator window 412 is smaller than the area of the area of the solder joint 475 at the outer surface 411 (FIGS. 4B and 4C) of the insulating layer 410. In addition, the perimeter of the corresponding insulator window 412 is disposed inside the perimeter of the solder joint 475 at the outer surface 411 of the insulating layer 410 where base 473 is disposed. In other words, a portion of solder bump 470 and the resulting solder joint 475 is disposed on top of the outer surface 411 of the insulating layer 410. Additionally, the area of the corresponding bonding layer window 275 is larger than the cross-sectional area of the solder joint 475 at the outer surface 411 of the insulating layer 410. Also, the perimeter of the corresponding bonding layer window 275 is disposed outside the perimeter of the solder joint 475 at the outer surface 411 of the insulating layer 410. In other words, bonding layer 270 does not touch the solder joint 475.

The invention has been described in detail with particular reference to certain preferred embodiments thereof, but it will be understood that variations and modifications can be effected within the spirit and scope of the invention.

The invention claimed is:

1. A piezoelectric printing device comprising:
   a substrate;
   an array of at least one row of drop ejectors, each row being aligned along a row direction, each drop ejector including:
      a pressure chamber disposed on a first side of the substrate, the pressure chamber being bounded by a first side wall and a second side wall; and
      a nozzle disposed in a nozzle layer that is formed on a second side of the substrate opposite to the first side;
   a piezoelectric plate having a first surface that is disposed proximate to the first side of the substrate;
   a bonding layer disposed between the piezoelectric plate and the substrate, the bonding layer having at least one bonding layer window;
   a first electrode layer disposed on the first surface of the piezoelectric plate, wherein the first electrode layer includes:
      a first signal line corresponding to each pressure chamber, each first signal line leading to a corresponding first signal interconnect pad; and
      ground traces disposed on both sides of each pressure chamber, the ground traces being electrically connected to at least one first ground interconnect pad;
   a second electrode layer disposed on the first side of the substrate, wherein the second electrode layer includes:
      a second signal line corresponding to each first signal line, each second signal line leading to a corresponding second signal interconnect pad and a signal input pad, wherein the first signal interconnect pad is electrically connected to the second signal interconnect pad through a signal solder joint, wherein the signal solder joint extends through a corresponding bonding layer window;
      a second ground interconnect pad corresponding to each first ground interconnect pad, wherein each first ground interconnect pad is electrically connected to the corresponding second ground interconnect pad through a ground solder joint; and
      at least one ground return pad that is electrically connected to a plurality of second ground interconnect pads; and
   at least one common ground bus that is electrically connected to the at least one ground return pad.

2. The piezoelectric printing device of claim 1, wherein the at least one common ground bus is disposed in the second electrode layer on the first side of the substrate.

3. The piezoelectric printing device of claim 1, further comprising:
   an insulating layer disposed over the second electrode layer on the first side of the substrate, the insulating layer having an insulator window corresponding to each second signal interconnect pad and each second ground interconnect pad; and
   a solder joint disposed over each insulator window in the insulating layer.

4. The piezoelectric printing device of claim 3, wherein for each solder joint:
   the area of a corresponding insulator window is smaller than the cross-sectional area of the solder joint at the outer surface of the insulating layer;
   the perimeter of the corresponding insulator window is disposed inside the perimeter of the solder joint at the outer surface of the insulating layer;
   the area of a corresponding bonding layer window is larger than the cross-sectional area of the solder joint at the outer surface of the insulating layer; and
   the perimeter of the corresponding bonding layer window is disposed outside the perimeter of the solder joint at the outer surface of the insulating layer.

5. The piezoelectric printing device of claim 1, wherein a cross-section of the solder joint is non-circular.

6. The piezoelectric printing device of claim 5, wherein the cross-section of the solder joint is substantially polygonal.

7. The piezoelectric printing device of claim 5, wherein the cross-section of the solder joint includes a concave portion.

8. The piezoelectric printing device of claim 1, further comprising:
   an insulating layer disposed over the first electrode layer on the first surface of the piezoelectric plate, the insulating layer having an insulator window corresponding to each first signal interconnect pad and each first ground interconnect pad; and
   a solder joint disposed over each insulator window in the insulating layer.

9. The piezoelectric printing device of claim 8, wherein for each solder joint:
   the area of a corresponding insulator window is smaller than the cross-sectional area of the solder joint at the outer surface of the insulating layer;
   the perimeter of the corresponding insulator window is disposed inside the perimeter of the solder joint at the outer surface of the insulating layer;
   the area of a corresponding bonding layer window is larger than the cross-sectional area of the solder joint at the outer surface of the insulating layer; and
   the perimeter of the corresponding bonding layer window is disposed outside the perimeter of the solder joint at the outer surface of the insulating layer.

10. The piezoelectric printing device of claim 1, wherein the first electrode layer and the second electrode layer each include a copper layer.

11. The piezoelectric printing device of claim 10, wherein the first electrode layer and the second electrode layer each include at least one chrome layer.

12. The piezoelectric printing device of claim 1, wherein the solder joint includes at least one of tin, indium and gold.

13. The piezoelectric printing device of claim 1, wherein the bonding layer is an adhesive layer.

14. The piezoelectric printing device of claim 1, wherein the array includes at least two staggered rows of drop ejectors that are disposed on the substrate, each row being aligned along the row direction and spaced apart from other rows along a direction perpendicular to the row direction.

15. The piezoelectric printing device of claim 14, wherein the array includes at least one pair of staggered rows of drop ejectors, and wherein at least one ground bus is disposed between each pair of staggered rows.

16. The piezoelectric printing device of claim 14, wherein the nozzles of a first staggered row are proximate to the nozzles of a second staggered row, and wherein the pressure chambers of the first staggered row and the pressure chambers of the second staggered row extend in opposite directions from the respective nozzles.

17. The piezoelectric printing device of claim 16, wherein the signal input pads of the first staggered row of drop ejectors and the signal input pads of the second staggered row of drop ejectors are disposed between the nozzles of the first staggered row of drop ejectors and the nozzles of the second staggered row of drop ejectors; and wherein the common ground bus is disposed between the signal input pads of the first staggered row of drop ejectors and the signal input pads of the second staggered row of drop ejectors.

18. The piezoelectric printing device of claim 17, wherein all signal input pads and ground return pads are exposed through an opening in the piezoelectric plate.

19. The piezoelectric printing device of claim 1, wherein a distance between a first signal line and an adjacent ground trace is greater than one tenth of a width of the pressure chamber.

20. The piezoelectric printing device of claim 1, wherein a width of a first signal line is greater than one tenth of a width of the pressure chamber.

21. The piezoelectric printing device of claim 1, wherein a distance between a first signal line and an adjacent ground trace is greater than half of and less than twice a thickness of the piezoelectric plate.

22. The piezoelectric printing device of claim 1, wherein a width of a first signal line is greater than two tenths of a thickness of the piezoelectric plate.

23. The piezoelectric printing device of claim 1 wherein each first signal line extends in a direction perpendicular to the row direction and is disposed over a center of the corresponding pressure chamber.

24. The piezoelectric printing device of claim 1, wherein the ground traces are disposed midway between corresponding pressure chambers and extend in a direction perpendicular to the row direction.

25. The piezoelectric printing device of claim 1, further comprising a masking layer disposed over the second electrode layer, wherein the masking layer includes windows over the signal input pads and over the at least one ground return pad.

26. The piezoelectric printing device of claim 1, wherein the ground traces have a width that is greater than a width of the side walls of the pressure chambers.

27. The piezoelectric printing device of claim 1, wherein the piezoelectric plate is poled along a direction that is perpendicular to the first surface of the piezoelectric plate.

28. A piezoelectric printing device comprising:
a substrate;
an array of at least one row of drop ejectors, each row being aligned along a row direction, each drop ejector including:
a pressure chamber disposed on a first side of the substrate, the pressure chamber being bounded by a first side wall and a second side wall; and
a nozzle disposed in a nozzle layer that is formed on a second side of the substrate opposite to the first side;
a piezoelectric plate having a first surface that is disposed proximate to the first side of the substrate;
a bonding layer disposed between the piezoelectric plate and the substrate, the bonding layer having at least one bonding layer window;
a first electrode layer disposed on the first surface of the piezoelectric plate, wherein the first electrode layer includes:
a first signal line corresponding to each pressure chamber, each first signal line leading to a corresponding first signal interconnect pad; and
ground traces disposed on both sides of each pressure chamber, the ground traces being electrically connected to at least one first ground interconnect pad;
a second electrode layer disposed on the first side of the substrate, wherein the second electrode layer includes:
a second signal line corresponding to each first signal line, each second signal line leading to a corresponding second signal interconnect pad and a signal input pad, wherein the first signal interconnect pad is electrically connected to the second signal interconnect pad through a signal solder joint;
a second ground interconnect pad corresponding to each first ground interconnect pad, wherein each first ground interconnect pad is electrically connected to the corresponding second ground interconnect pad through a ground solder joint; and
at least one ground return pad that is electrically connected to a plurality of second ground interconnect pads;
at least one common ground bus that is electrically connected to the at least one ground return pad;
an insulating layer selected from the group a) and b) consisting of:
a) an insulating layer disposed over the second electrode layer on the first side of the substrate, the insulating layer having an insulator window corresponding to each second signal interconnect pad and each second ground interconnect pad; and
b) an insulating layer disposed over the first electrode layer on the first surface of the piezoelectric plate, the insulating layer having an insulator window corresponding to each first signal interconnect pad and each first ground interconnect pad; and
a solder joint disposed over each insulator window in the insulating layer, wherein for each solder joint:
the area of a corresponding insulator window is smaller than the cross-sectional area of the solder joint at the outer surface of the insulating layer;
the perimeter of the corresponding insulator window is disposed inside the perimeter of the solder joint at the outer surface of the insulating layer;
the area of a corresponding bonding layer window is larger than the cross-sectional area of the solder joint at the outer surface of the insulating layer; and
the perimeter of the corresponding bonding layer window is disposed outside the perimeter of the solder joint at the outer surface of the insulating layer.

* * * * *